United States Patent [19]
Shiba et al.

[11] Patent Number: 5,384,282
[45] Date of Patent: Jan. 24, 1995

[54] METHOD FOR PRODUCING AN EMBEDDED OPTOELECTRONIC INTEGRATED CIRCUIT

[75] Inventors: Tetsuo Shiba; Shogo Takahashi, both of Itami, Japan

[73] Assignee: Mitsubishi Denki Kabushiki Kaisha, Tokyo, Japan

[21] Appl. No.: 87,086

[22] Filed: Jul. 7, 1993

Related U.S. Application Data

[63] Continuation of Ser. No. 695,981, May 6, 1991, abandoned.

[30] Foreign Application Priority Data

Oct. 29, 1990 [JP] Japan .................... 2-294082

[51] Int. Cl.$^6$ ..................... H01L 21/205; H01L 27/14
[52] U.S. Cl. ..................... 437/90; 437/225; 437/5; 117/97
[58] Field of Search ............ 437/89, 90, 225, 5; 117/97

[56] References Cited

U.S. PATENT DOCUMENTS

| | | | |
|---|---|---|---|
| 3,979,237 | 9/1976 | Morcom et al. | 437/980 |
| 4,141,765 | 2/1979 | Druminski et al. | 437/90 |
| 4,948,751 | 8/1990 | Okamoto et al. | 437/90 |
| 4,999,313 | 3/1991 | Arikawa et al. | 437/90 |
| 5,084,410 | 1/1992 | Eguchi et al. | 437/107 |
| 5,278,092 | 1/1994 | Sato | 437/90 |
| 5,292,689 | 3/1994 | Cronin et al. | 437/90 |

FOREIGN PATENT DOCUMENTS

| | | |
|---|---|---|
| 0224646 | 6/1987 | European Pat. Off. . |
| 0241316 | 10/1987 | European Pat. Off. . |
| 0276959 | 8/1988 | European Pat. Off. ............ 437/90 |
| 0363100 | 4/1990 | European Pat. Off. . |

OTHER PUBLICATIONS

Miura et al., "Optoelectronic ... Photodiode", Applied Physics Letters 48(21), May 1986, pp. 1461–1463.

*Primary Examiner*—Mary Wilczewski
*Attorney, Agent, or Firm*—Leydig, Voit & Mayer

[57] ABSTRACT

Element production process in a method for producing an embedded type optoelectronic integrated circuit comprising an optical element part and a signal processing part, includes steps of producing a mask film on a surface of the substrate and removing a predetermined region of the film to produce a selective growth mask, producing a concave portion at a predetermined region on the surface of the substrate by etching using the selective growth mask, producing a crystal layer which is to be an optical element part in the concave part by crystal growth using the selective growth mask, flattening the surface of the crystal layer by grinding swelling crystal at the edges of the concave portion, and removing the selective growth mask and conducting mirror polishing by mechanochemical etching. Therefore, even when an optical device is embedded in the substrate using crystal growth method, a step due to swelling crystal does not arise on the substrate and parts of wafer damaged by grinding is removed. Thus, the following process is eased.

6 Claims, 3 Drawing Sheets

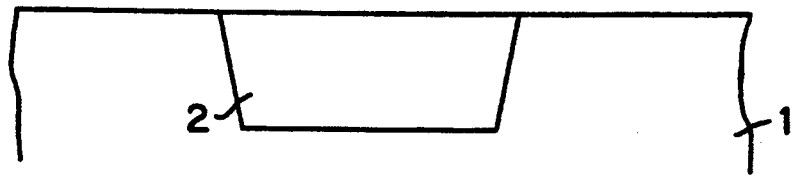
FIG. I(e)
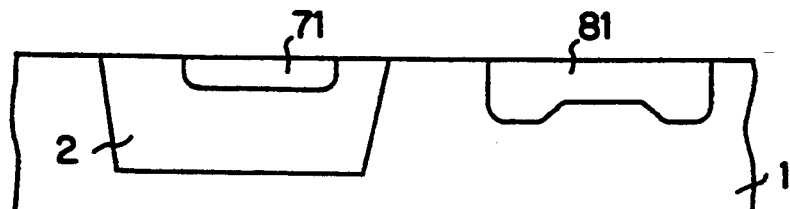
FIG. I(f)
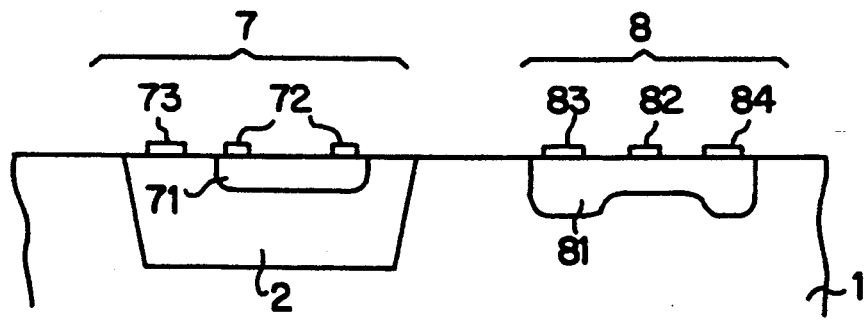
FIG. I(g)
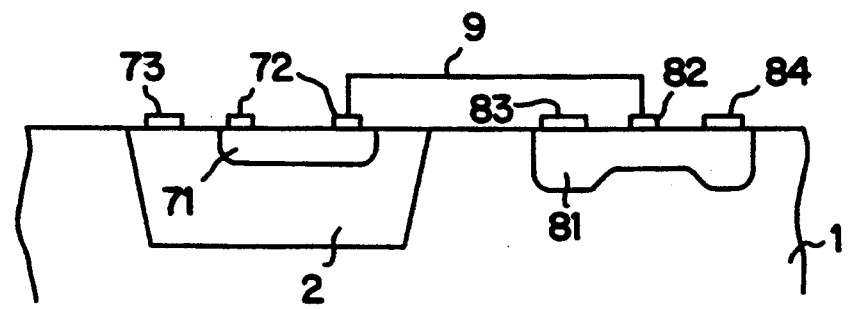
FIG. I(h)

METHOD FOR PRODUCING AN EMBEDDED OPTOELECTRONIC INTEGRATED CIRCUIT

This application is a continuation of application Ser. No. 07/695,981, filed on May 6, 1991, now abandoned.

FIELD OF THE INVENTION

The present invention relates to a method for producing an embedded optoelectronic integrated circuit (hereinafter referred to as OEIC).

BACKGROUND OF THE INVENTION

FIG. 2 is a schematic diagram illustrating a prior art OEIC reported at the meeting of the Applied Physics Society, in autumn 1990. In the OEIC, InP series material are used for an optical device and GaAs is used for an electronic device. The devices comprising different kinds of materials are integrated on a substrate comprising GaAs.

In the figure, reference numeral 1 designates a GaAs substrate. An optical element (optical device) 7 comprising an InP series material diode includes a p type region 71 produced by ion implantation of such as Mg ions, p side electrode 72 and, an n side electrode 73. An FET 8 includes an active layer 81 of several thousand angstroms thick produced by ion implantation of such as Si, a gate electrode 82, a source electrode 83 and a drain electrode 84. In addition, the p side electrodes 72 of the optical device 7 and the gate electrode 82 of the FET 8 are connected by wiring 9.

The layer 2 of the InP series optical element 7 comprises a light absorption layer 21 about 5 micron thickness and a buffer layer 22 about 5 microns thick disposed between the substrate 1 and the light absorption layer 21 so as to relieve stress due to the difference in lattice constant between the GaAs substrate 1 and the light absorption layer 21. Accordingly, when the InP series optical element 7 is produced on the. GaAs substrate 1, a mesa about 10 micron thick is formed on a part of the substrate 1. On the other hand, the FET 8 usually has a planar element structure because the active layer 81 is produced by such as ion implantation on the GaAs substrate 1. Therefore, a step of about 10 microns is formed in the device which has the InP series optical device 7 and the FET 8 on the same substrate, because of the difference in height between the InP series optical device and the wafer surface.

A description is given of the operation hereinafter.

When light is incident on the optical device 7, charge carriers are generated by photovoltaic conversion and the optical current due the carriers is applied to the gate electrode 82 of the FET 8 via the wiring 9. Thus, the current flowing between the source electrode 83 and the drain electrode 84 of the FET part 8 is controlled.

In the OEIC produced by the prior art method as described above, since the InP series optical device and the FET which are produced on the same substrate make a step, the photoresist is discontinuous at a corner of the step and the photoresist is not uniform in thickness on the surface of the substrate region which is to be the FET during the production process of the wafer. Thus, the mesa prevents production of a fine pattern. In addition, due to the difference in height, it is impossible to focus light on both the surface of the GaAs substrate and the surface of the InP series crystal at the same time during pattern transfer. This makes it difficult to carry out photolithography processing such as patterning of the photoresist.

Such difficulty in the fabrication process can be solved by embedding the optical device in the substrate. However, in of producing an optical device embedded in the substrate using a method of producing a well in the substrate and carrying out crystal growth on the entire surface of the well as recited in Japanese Published Patent Application No. 2-125664, it is troublesome to grind the crystal to a predetermined thickness after the crystal growth, and an additional process for maintaining the grinding precision is required. In addition, it is difficult to carry out the crystal growth such that the surface becomes planar because the crystal growth is not planar. Accordingly, it is inevitable that a step as shown in FIG. 2 is produced in producing an OEIC.

In a method disclosed in Japanese Published Patent Application No. 63-90867, to produce a device in which an optical device part is embedded in the substrate without non-planar crystal growth, an optical device is produced in a well in a region whose width is narrower than that of the well. However, in this method, narrow grooves are produced at the both sides of the optical device and problems such as breakage of the photoresist still remain unsolved.

SUMMARY OF THE INVENTION

It is an object of the present invention to provide a method for producing an OEIC in which an optical device is embedded in the substrate using a crystal growth method without producing a step on the surface of the wafer.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

In accordance with the present invention, a method for producing an OEIC includes an element production process comprising depositing a mask film on a surface of a substrate and removing a predetermined region of the film to produce a selective growth mask, producing a concave portion at a predetermined region in the substrate by etching using the selective growth mask, producing a crystal layer which is to be an optical element in the concave part by crystal growth using the selective growth mask, flattening the surface of the crystal layer by grinding the grown crystal at the edges of the concave portion, and removing the selective growth mask and mirror polishing by mechanochemical etching. Therefore, even when an optical device part is embedded in the substrate using crystal growth, no non-planar crystal growth occurs on the substrate, and further removal of damaged parts of the wafer eases the subsequent production process.

In accordance with another aspect of the present invention, the step of producing a crystal layer includes covering the crystal layer which is to be an optical element part after producing the crystal layer and removing the extraneous crystal matter on the selective growth mask by etching. Therefore, the extraneous crystal matter does not impede the grinding to be carried out later.

BRIEF DESCRIPTION OF THE DRAWINGS

Figures 1(a) to 1(h) are diagrams illustrating a process of producing an embedded type optoelectronic integrated circuit in accordance with an embodiment of the present invention;

DETAILED DESCRIPTION OF THE PREFERRED EMBODIMENTS

Figure 1A:
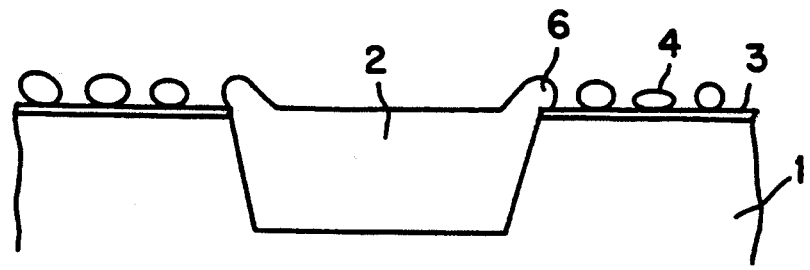

An embodiment of the present invention will be described in detail with reference to the drawings.

FIGS. 1(a) to 1(h) show process steps for producing an embedded type OEIC in accordance with an embodiment of the present invention. The same reference numerals as those of FIG. 2 designate the same or corresponding portions. Reference numeral 3 designates a selective growth mask. Polycrystalline material 4 is produced on the selective growth mask 3. Crystal 6 is produced by selective growth.

A description is given of production process steps.

Figure 2:
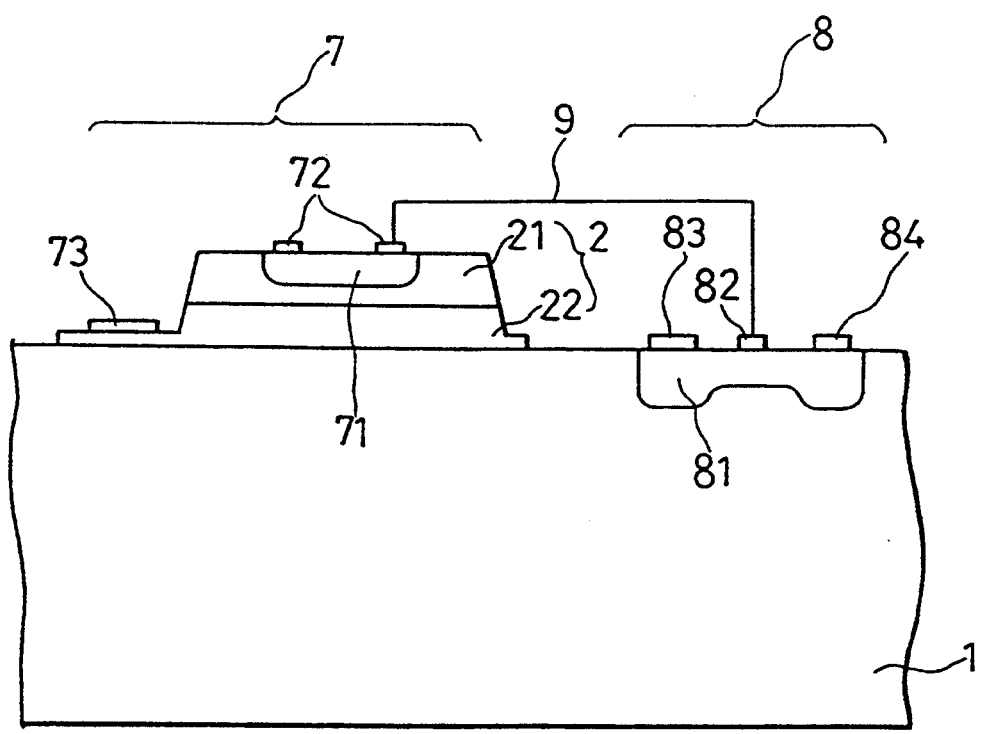
FIG. 2 is a cross-sectional view schematically showing a structure of a prior art OEIC.

A film comprising such as silicon nitride is produced on the entire surface of the substrate 1. A part of the silicon nitride film where an InP series optical device is to be produced is removed, thereby forming a selective growth mask 3. Next, a concave region or a well which is to be filled up with crystalline material making an InP series optical device is produced by wet etching using the selective growth mask 3. Thereafter, an InP series crystalline layer 2 is selectively grown in the well using vapor phase growth such as MOCVD(metal organic chemical vapor deposition). At that time polycrystalline material 4 is deposited on the selective growth mask 3. The crystalline growth extends out of the end part 6 of the well as shown in FIG. 1(a).

Figure 1B:
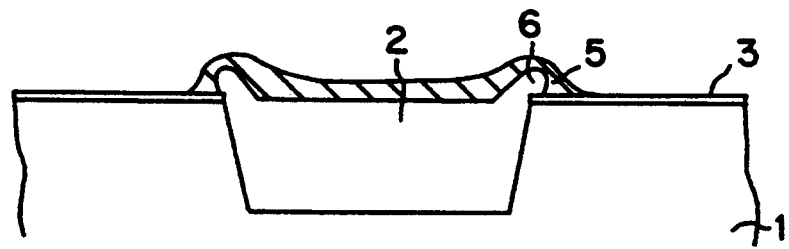
Figure 1C:
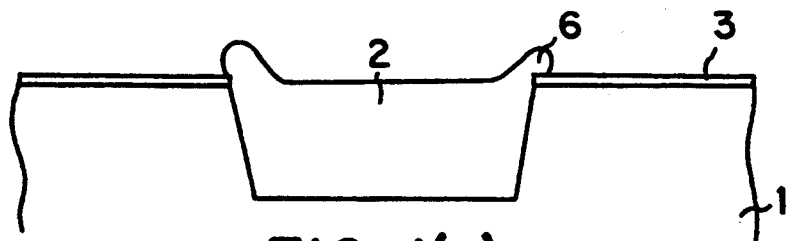

As shown in FIG. 1(b), the growth layer 2 is covered by the photoresist 5, and the polycrystalline material 4 on the selective growth mask 3 is removed by etching. Thereafter, the photoresist 5 is removed as shown in figure 1(c).

Figure 1D:
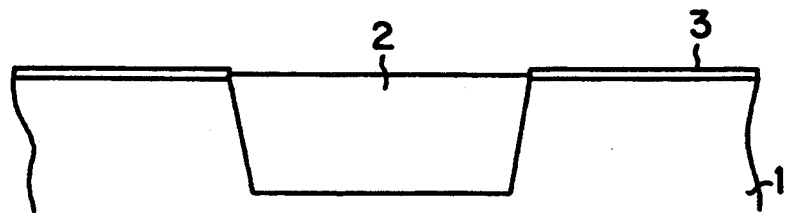

The non-planar grown crystalline material 6 at the edges of the well is removed by grinding, for example, with diamond particles as shown in FIG. 1(d).

Subsequently, as shown in FIG. 1(e), the selective growth mask 3 is removed by wet etching and the wafer surface is etched by mechanochemical etching which is carried out with a cloth dipped in an etching solution, so as to remove the layer damaged by grinding and to produce a mirror surface.

The selective growth layer 2 can be embedded with a planar surface in the substrate using the above-described production process.

Next, a diode p .type region 71 is produced in the selective growth layer 2 by ion implantation of such as Mg ions and further Si ions are ion implanted into the substrate 1 to a thickness of several thousand angstroms to produce an active layer 81 of the FET as shown in FIG. 1(f).

Then, an n side electrode 73 and p side electrode 72 of the diode, and a gate electrode 82, a source electrode 83, and a drain electrode 84 of the FET are produced at predetermined regions, thereby completing an optical device 7 and an FET 8, as shown in FIG. 1(g).

Finally, as shown in FIG. 1(h), the p side electrode 72 of the optical device 7 and the gate electrode 82 of the FET 8 are connected with each other by wiring 9, thereby completing an embedded OEIC.

In the above-described embodiment, after growth of the selective growth layer 2 in the well of the substrate 1, the non-planar crystalline material 6 at the edges of the growth layer 2 is removed by grinding. Therefore, the surface of the substrate 1 is perfectly planar even when an optical device is embedded in the substrate 1 using the crystal growth method, and as a result, the fine pattern can be produced without photoresist discontinuities and non-uniformities in the thickness of the photoresist in the wafer process. It is also possible to focus light on both the surface of the substrate 1 and the surface of the InP series crystal layer 2 at the same time, thereby carrying out photolithography processes easily.

In addition, since the crystal growth layer 2 which is to be the optical element 7 is covered by photoresist 5 and the surface of wafer is mirror polished by mechanochemical etching, so that the portion which is damaged during grinding is removed. Accordingly, the production process of the device thereafter becomes easier, and as a result, productivity of an embedded OEIC is enhanced.

Since polycrystalline material 4 on the selective growth mask 3 is removed by etching, there is no obstacle to the following grinding process.

In the above-described embodiment, the surface of the wafer is flattened through the process steps of removing polycrystalline material, grinding, and mechanochemical etching, but depending on the state of crystal growth, the process of removing the polycrystalline material can be omitted.

The selective growth mask 3 may be removed before grinding.

While in the above-described embodiment, GaAs is used for substrate and InP is used for optical device, other combinations of materials, for example, GaAs and GaAs, InP and InP, or InP and GaAs can be used for the substrate and optical device, respectively.

As is evident from the foregoing description, according to the invention, a method for producing an embedded OEIC comprises the steps of producing a selective growth mask on a substrate, producing a concave portion at a predetermined region of the substrate by etching using the selective growth mask, producing a crystalline layer, which is to be an optical element, in the concave portion, flattening the surface of the crystal layer by grinding the non-planar grown crystalline material at the edges of the crystalline layer. Therefore, even when the optical device is embedded in the substrate using a crystalline growth, the surface of wafer does not have a step. Since the surface of the substrate which is flattened is mirror polished by mechanochemical etching, portions of the wafer damaged by grinding are removed and the subsequent production process can be carried out easily.

Furthermore, after producing the crystalline layer, the crystalline layer which is to be an optical element is covered by photoresist and extraneous matter on the selective growth mask is removed by etching. Therefore, there is no obstacle to the grinding, and the grinding can be conducted smoothly.

What is claimed is:

1. A method for producing an embedded optoelectronic integrated circuit in a substrate including a planar surface, the optoelectronic integrated circuit comprising an optical element and a signal processing element in the substrate contiguous with the planar surface of the substrate comprising:

depositing a mask film on a surface of a semiconductor substrate and removing a predetermined region of said mask film to produce a selective growth mask;

etching said substrate using said selective growth mask as an etching mask to produce a recess in said substrate;

growing a crystalline semiconductor material for making an optical element in the recess using said selective growth mask to limit growth of said crystalline semiconductor material beyond the recess;

covering said crystalline semiconductor material grown in the recess with a film;

etching and thereby removing any extraneous matter deposited on said selective growth mask and not covered by said film;

flattening the surface of said substrate by grinding portions of the grown crystalline material that protrude from the surface;

removing said selective growth mask; and polishing the surface to a mirror finish by mechanochemical etching.

2. The method of claim 1 comprising, after polishing the surface to a mirror finish by mechanochemical etching:

implanting dopant impurity ions in a first part of said grown crystalline semiconductor material to form a rectifying junction with a second part of said grown crystalline semiconductor material;

implanting ions in said substrate to form an active layer spaced from said grown crystalline semiconductor material;

forming respective electrodes on the first part of said grown crystalline semiconductor material and on the second part of said grown crystalline semiconductor material, thereby forming the optical element; and forming source, gate, and drain electrodes on said active layer, thereby forming the signal processing element.

3. The method of claim 1 including removing said selective growth mask before grinding.

4. The method of claim 1 wherein said substrate is a III-V compound semiconductor and including growing a III-V compound semiconductor material for making said optical element.

5. The method of claim 1 including depositing silicon nitride as said mask film.

6. The method of claim 1 wherein said semiconductor substrate is GaAs including growing InP as said crystalline semiconductor material.

* * * * *